United States Patent
Waki et al.

(10) Patent No.: US 8,945,251 B2
(45) Date of Patent: Feb. 3, 2015

(54) CUTTING TOOL

(75) Inventors: Masahiro Waki, Satsumasendai (JP); Mitsuru Hasegawa, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 138 days.

(21) Appl. No.: 13/824,924

(22) PCT Filed: Sep. 26, 2011

(86) PCT No.: PCT/JP2011/071854
§ 371 (c)(1),
(2), (4) Date: Mar. 18, 2013

(87) PCT Pub. No.: WO2012/043459
PCT Pub. Date: Apr. 5, 2012

(65) Prior Publication Data
US 2013/0177361 A1     Jul. 11, 2013

(30) Foreign Application Priority Data

Sep. 29, 2010 (JP) ................. 2010-219069
Oct. 15, 2010 (JP) ................. 2010-232671

(51) Int. Cl.
*B23B 27/14* (2006.01)
*C23C 14/06* (2006.01)
*C23C 30/00* (2006.01)

(52) U.S. Cl.
CPC ........... *B32B 27/148* (2013.01); *C23C 14/0664* (2013.01); *C23C 30/005* (2013.01)
USPC ............... 51/307; 51/309; 428/697; 428/698; 428/699

(58) Field of Classification Search
USPC ..................... 51/307, 309; 428/697, 698, 699
See application file for complete search history.

(56) References Cited

U.S. PATENT DOCUMENTS

| | | | |
|---|---|---|---|
| 6,586,122 B2 * | 7/2003 | Ishikawa et al. | 428/698 |
| 6,767,658 B2 * | 7/2004 | Yamamoto et al. | 428/698 |
| 6,824,601 B2 * | 11/2004 | Yamamoto et al. | 428/699 |
| 6,838,151 B2 * | 1/2005 | Kato | 428/332 |
| 7,056,602 B2 * | 6/2006 | Horling et al. | 428/697 |
| 7,083,868 B2 * | 8/2006 | Horling et al. | 51/309 |
| 7,211,138 B2 * | 5/2007 | Yamamoto et al. | 428/697 |
| 7,510,761 B2 * | 3/2009 | Kondo et al. | 428/698 |
| 7,521,131 B2 * | 4/2009 | Yamamoto | 428/699 |
| 7,811,683 B2 * | 10/2010 | Zhu et al. | 51/307 |
| 7,939,186 B2 * | 5/2011 | Takaoka et al. | 428/697 |

(Continued)

FOREIGN PATENT DOCUMENTS

| | | |
|---|---|---|
| JP | 9295204 | 11/1997 |
| JP | 09-323204 | * 12/1997 |

(Continued)

*Primary Examiner* — Archene Turner (57) ABSTRACT

A cutting tool with a substrate which is coated with a coating layer containing $Ti_aAl_bNb_dM_e(C_{1-x}N_x)$, where M represents one or more elements selected from among Si, W, Mo, Ta, Hf, Cr, Zr and Y, where $0.1 \leq a \leq 0.7$, $0 \leq b \leq 0.8$, $0.02 \leq d \leq 0.25$, $0 \leq e \leq 0.25$, $a+b+d+e=1.0$ and $0 \leq x \leq 1$ and is provided with a rake face; a flank face; a cutting edge between the rake face and the flank face; and droplets on the surface of the coating layer. The droplets include finer droplets having particle diameters of 300 nm or less; and coarser droplets having particle diameters of 1000 nm or more. The flank face has a higher percentage of the finer droplets than the rake face. An Nb content in the coarser droplets on the flank face is higher than an Nb of the coarser droplets on the rake face.

8 Claims, 4 Drawing Sheets

(56) References Cited

U.S. PATENT DOCUMENTS

| | | | |
|---|---|---|---|
| 8,062,776 B2 * | 11/2011 | Waki et al. | 428/698 |
| 8,227,098 B2 * | 7/2012 | Åstrand | 428/698 |
| 8,236,411 B2 * | 8/2012 | Waki et al. | 428/697 |
| 8,586,214 B2 * | 11/2013 | Sakamoto et al. | 428/697 |
| 8,623,525 B2 * | 1/2014 | Waki et al. | 428/697 |
| 8,691,366 B2 * | 4/2014 | Waki et al. | 428/148 |
| 2010/0034603 A1 | 2/2010 | Waki et al. | |
| 2013/0022419 A1 | 1/2013 | Sakamoto et al. | |

FOREIGN PATENT DOCUMENTS

| | | | |
|---|---|---|---|
| JP | 10-251831 | * | 9/1998 |
| JP | 2002346812 | | 12/2002 |
| JP | 2005-111574 | * | 4/2005 |
| JP | 2007-046103 | * | 2/2007 |
| JP | 2008264975 | | 11/2008 |
| WO | 2008078592 | | 7/2008 |
| WO | 2011122554 | | 10/2011 |

* cited by examiner

CUTTING TOOL

CROSS-REFERENCE TO RELATED APPLICATIONS

This application is a national phase of the International Patent Application PCT/JP2011/071854 filed on Sep. 26, 2011 that claims the priority from Japanese patent applications 2010-219069 filed on Sep. 29, 2010 and 2010-232671 filed on Oct. 15, 2010. The content of these aforementioned documents is herewith incorporated by reference in their entirety.

TECHNICAL FIELD OF THE INVENTION

The present invention relates to a cutting tool in which a coating layer is formed on a surface of a substrate.

BACKGROUND OF THE INVENTION

Cutting tools need to have wear resistance, welding resistance, and fracture resistance. Therefore, cutting tools, in which a variety of coating layers are formed on surfaces of hard substrates such as WC-based cemented carbide or TiCN-based cermet, are widely used.

In general, although TiCN layers and TiAlN layers are widely used as such coating layers, various coating layers are under development for the purpose of improvement in wear resistance and enhanced fracture resistance.

For example, Patent Literature 1 discloses a coating in which Ti in a (TiAl)N-based coating layer is partially replaced with Si and describes that the oxidation of the coating can be suppressed. Patent Literature 2 discloses a (Ti, Al)N coating layer in which a flank face has a higher Ti proportion than a rake face. Furthermore, Patent Literature 3 discloses that a TiAlN-based hard coating with a thickness of 1 to 5 μm is formed on a surface of a substrate such that coarse grains, which are present in the hard coating and have a size not less than the thickness of the coating, are 5% by area or less and the surface roughness Ra thereof is 0.1 μm or less or the surface roughness Rz thereof is 1 μm or less, whereby the welding resistance and wear resistance of the hard coating are improved.

The following is a list of the aforementioned background art:

PTL 1: Japanese Unexamined Patent Application Publication No. 09-295204
PTL 2: Japanese Unexamined Patent Application Publication No. 2008-264975
PTL 3: Japanese Unexamined Patent Application Publication No. 2002-346812

However, as disclosed in Japanese Patent Application Publication No. 09-295204, wear resistance and fracture resistance are not necessarily sufficient even though a coating layer containing Ti, Al, and Si is formed, and therefore, further improvement in wear resistance and fracture resistance are desired. Furthermore, further improvement is requested even for a coating layer having a difference in Ti proportion between a rake face and a flank face as disclosed in Japanese Patent Application Publication No. 2008-264945 and for a coating layer in which a number of coarse grains in a surface of the coating layer is made small as disclosed in Japanese Patent Application Publication No. 2002-346812.

Accordingly, it is an object of the present invention to provide a cutting tool including a coating layer capable of increasing oxidation resistance and fracture resistance of a rake face and a flank face.

SUMMARY OF THE INVENTION

The aforementioned object of the present invention is achieved by a cutting tool comprising coating layer that is formed on a surface of a cutting tool substrate comprising a rake face and a flank face, and that is represented by $Ti_{1-a-b-c}Al_aSi_bM_c(C_{1-x}N_x)$ (where M is at least one selected from the group consisting of Y, Group-4, 5, and 6 metals, excluding Ti; $0.3 \leq a \leq 0.7$; $0.01 \leq b \leq 0.2$; $0 \leq c \leq 0.3$; and $0 < x \leq 1$ at the rake face), an $Si_f/Si_r$ ratio is from 1.05 to 3.2 and an $Al_r/Al_f$ ratio is from 1.03 to 1.6, where $Si_r$ is a proportion of Si in the coating layer at the rake face, $Si_f$ is a proportion of Si in the coating layer at the flank face, $Al_r$ is a proportion of Al in the coating layer at the rake face, and $Al_f$ is a proportion of Al in the coating layer at the flank face.

According to a cutting tool according to the present invention, the proportion of Si in a coating layer having a predetermined composition range is such that a flank face has a composition more than that of a rake face and the proportion of Al in the coating layer is such that the rake face has a composition more than that of the flank face; hence, the coating layer at the rake face has high oxidation resistance and therefore the progress of wear due to the welding or oxidation of chippings can be reduced. Furthermore, the coating layer at the flank face has high chipping resistance; hence, a smooth machined surface can be formed and the wear of the flank face due to chipping can be reduced, resulting in that a difficult-to-cut material can be machined with good wear resistance and welding resistance under severe cutting conditions and a smooth dullness-free machined surface can be achieved.

DETAILED DESCRIPTION OF THE DRAWINGS

Figure 1:
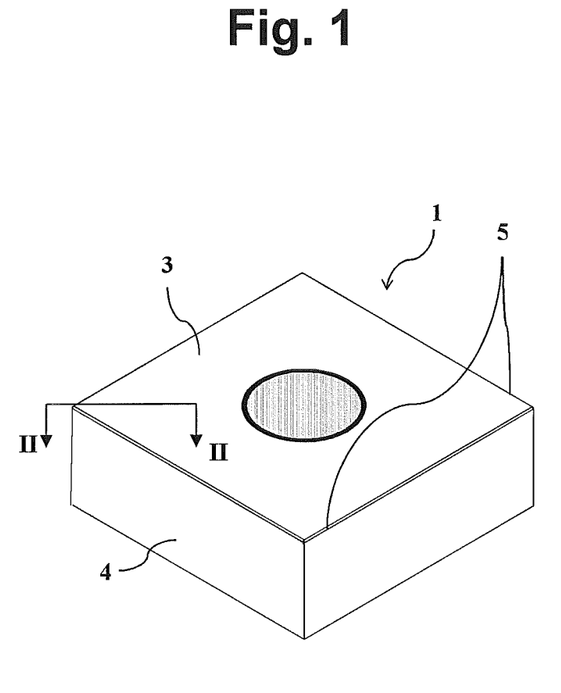
FIG. 1 is a schematic perspective view showing an exemplary cutting tool according to an embodiment of the present invention.
Figure 2:
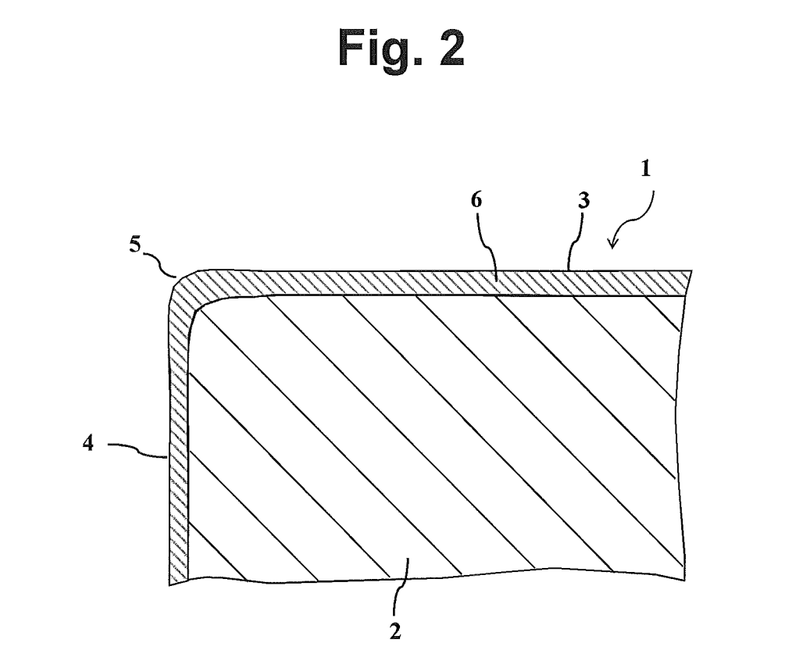
FIG. 2 is a sectional view along an II-II line in FIG. 1.
Figure 3:
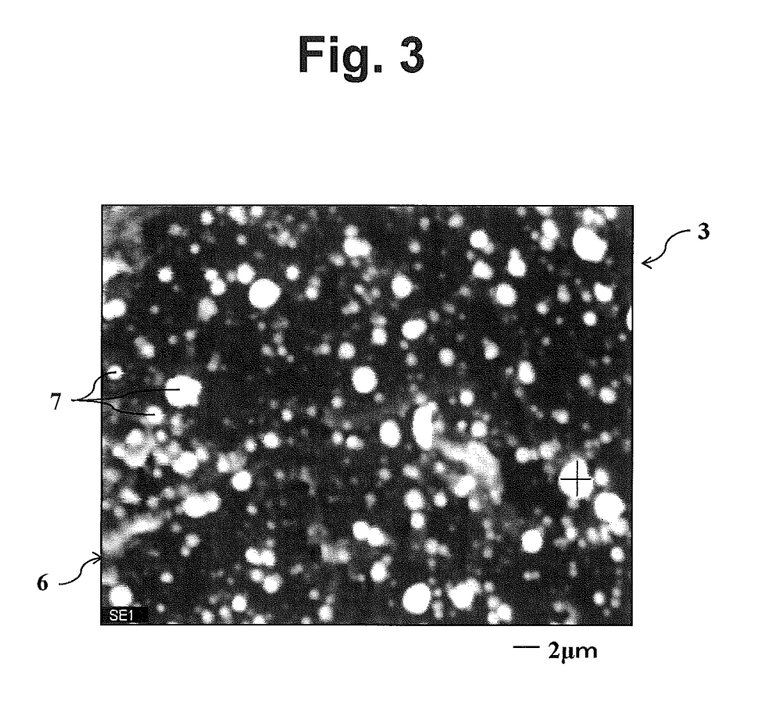
FIG. 3 is a SEM photograph of a surface of a coating layer of the cutting tool shown in FIG. 1 at a rake face.
Figure 4:
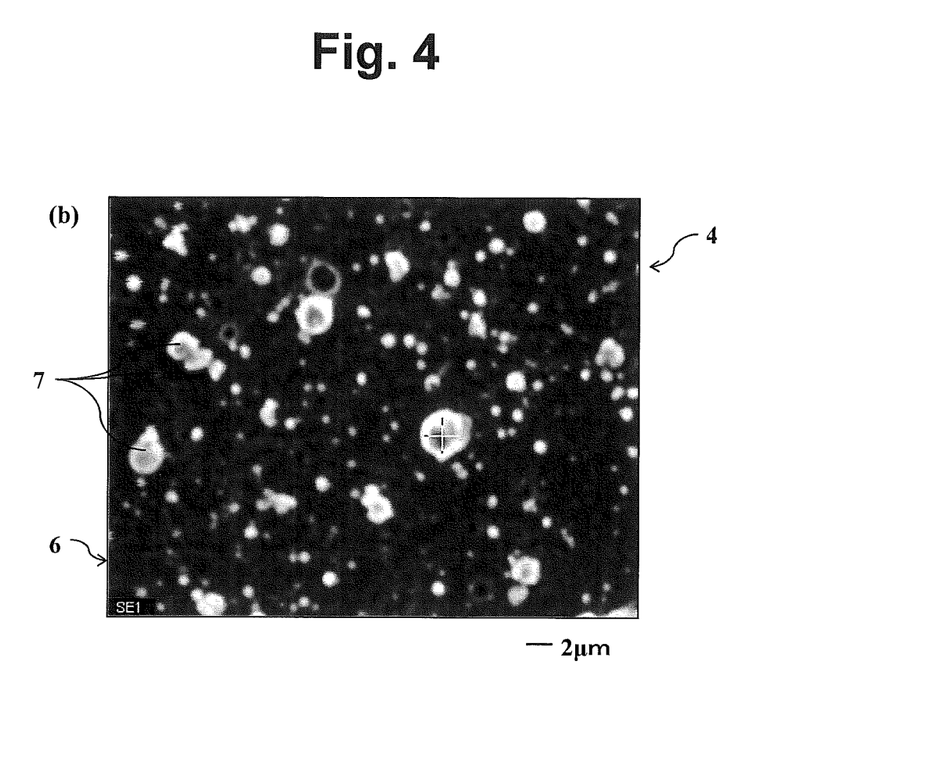
FIG. 4 is a SEM photograph of a surface if a coating layer of the cutting tool shown in FIG. 1 at a flank face.

FIG. 1 is a schematic perspective view showing an exemplary cutting tool according to an embodiment. FIG. 2 is a sectional view along an II-II line in FIG. 1. FIG. 3 is a scanning electron microscope (SEM) photograph of a surface of a coating layer of the cutting tool shown in FIG. 1 at a rake face. FIG. 4 is a SEM photograph of a surface of a coating layer of the cutting tool shown in FIG. 2 at a flank face.

With reference to FIGS. 1 and 2, it is configured that the cutting tool 1 includes a rake face 3 in a principal surface, a flank face 4 in a side surface, and a cutting edge 5 in the line of intersection of the rake face 3 and the flank face 4, and that the coating layer 6 is coated on a surface of a substrate 2.

It is configured that the coating layer 6 is made of $Ti_{1-a-b-c}Al_aSi_bM_c(C_{1-x}N_x)$, where M is at least one selected from the group consisting of Y, group-4, 5, and 6 metals excluding Ti in the periodic table; $0.3 \leq a \leq 0.7$; $0.01 \leq b \leq 0.2$; $0 \leq c \leq 0.3$; and $0 < x \leq 1$ in the rake face 3, that is, 30 atomic percent $\leq a \leq 70$ atomic percent; 1 atomic percent $\leq b \leq 20$ atomic percent; 0 atomic percent $\leq c \leq 30$ atomic percent; and 0 atomic percent $< x \leq 100$ atomic percent.

Herein, when a is less than 0.3, hardness characteristics or oxidation resistance is not obtained. In contrast, when a is greater than 0.7, a reduction in hardness is significant because a cubic phase transforms into a hexagonal phase. The preferred range of a is $0.3 \leq a \leq 0.7$ and particularly $0.44 \leq a \leq 0.65$. When b is less than 0.01, the toughness is low. In contrast, when b is greater than 0.2, a reduction in hardness is significant. The preferred range of b is $0.02 \leq b \leq 0.2$ and particularly $0.03 \leq b \leq 0.1$. When c is greater than 0.3, the coefficient of friction is large and wear resistance is not obtained. The preferred range of c is $0.02 \leq c \leq 0.22$ and preferably $0.03 \leq c \leq 0.15$.

The metal M is at least one selected from the group consisting of Y, group 4 metals other than Ti, group 5 metals, and group 6 metals in the periodic table, that is, at least one selected from the group consisting of Nb, W, Mo, Ta, Hf, Cr, Zr, V and Y. In particular, from the viewpoint that the hardness is good, it is preferred that Nb or W is contained. From the viewpoint that the wear resistance and oxidation resistance are good, it is preferred that Nb or Mo is contained. In the flank face 4, it is preferred that $0.3 \leq a \leq 0.6$, $0.02 \leq b \leq 0.3$, $0 \leq c \leq 0.3$, and $0 < x \leq 1$, that is, 30 atomic percent $\leq a \leq$ 60 atomic percent, 2 atomic percent $\leq b \leq$ 30 atomic percent, 0 atomic percent $\leq c \leq$ 30 atomic percent, and 0 atomic percent $< x \leq$ 100 atomic percent.

The coating layer 6 is composed such that the $Si_r/Si_f$ ratio is from 1.05 to 3.2 and the $Al_r/Al_f$ ratio is from 1.03 to 1.6, where $Si_r$ is the proportion of Si in the coating layer 6 at the rake face 3, $Si_f$ is the proportion of Si in the coating layer 6 at the flank face 4, $Al_r$ is the proportion of Al in the coating layer 6 at the rake face 3, and $Al_f$ is the proportion of Al in the coating layer 6 at the flank face 4. This allows the coating layer 6 at the rake face 3 to have high oxidation resistance such that the progress of wear due to the welding of chippings or oxidation of the coating layer 6 can be suppressed and also allows the coating layer 6 at the flank face 4 to have high chipping resistance such that a machined surface can be smoothed and the progress of wear due to chipping can be suppressed, resulting in that a smooth machined surface can be formed under cutting conditions likely to causing welding or fracture and the cutting tool 1 is allowed to have a long life.

Herein, in the above configuration, the $Si_r/Ti_r$ ratio of the rake face 3 is preferably less than the $Si_f/Ti_f$ ratio of the flank face 4, where $Ti_r$ is the proportion of Ti in the coating layer 6 at the rake face 3 and $Ti_f$ is the proportion of Ti in the coating layer 6 at the flank face 4. Furthermore, the $Al_r/Ti_r$ ratio of the rake face 3 is preferably greater than the $Al_f/Ti_f$ ratio of the flank face 4 in order to increase the welding resistance of the rake face 3 and the chipping resistance of the flank face 4.

The proportion of each element in the coating layer 6 can be measured using an energy dispersive X-ray spectroscopic (EDX, EDS) analyzer attached to a transmission electron microscopic measurement system. The proportion of Ti in the coating layer 6 can be calculated from the ratio of the peak intensity of Ti element to the sum of the peak intensities of the elements.

Herein, a peak (an energy of about 0.4 keV) corresponding to the Lα line of Ti determined by an energy dispersive X-ray spectroscopic (EDX) analysis overlaps with a peak corresponding to the Kα line of N element and therefore cannot be precisely measured. Hence, in the case where N element may possibly be contained, this peak is excluded from peaks used for calculation, the proportion of Ti ($Ti_r$, $Ti_f$) is determined using a peak (an energy of about 4.5 keV) corresponding to the Kα line of Ti, the proportion of each of metals including $Si_r$, $Si_f$, $Al_r$, and $Al_f$ is calculated from the amount thereof, and the $Si_r/Si_f$ ratio and $Al_r/Al_f$ ratio are determined. According to the present invention, in the measurement of $Al_r$ and $Al_f$ the average of measurements obtained from arbitrary five or more sites in the coating layer 6 is determined.

In the above configuration, the thickness of the coating layer 6 at the flank face 4 is preferably larger than the thickness of the coating layer 6 at the rake face 3 in order to increase the chipping resistance. The ratio $t_r/t_f$ of the thickness $t_r$ of the coating layer 6 at the rake face 3 to the thickness $t_f$ of the coating layer 6 at the flank face 4 preferably ranges from 0.45 to 0.85.

Furthermore, in this configuration, particulate matter called droplets 7 is present on a surface of the coating layer 6 as shown in FIGS. 3 and 4. The droplets 7 are different in composition from the coating layer 6. The proportion of Si in the droplets 7 at the flank face 7 is preferably higher than the proportion of Si in the droplets 7 at the rake face 3 in view of the balance between the suppression of the welding of chippings to the rake face 3 and the suppression of the chipping of the flank face 4.

The $Si_{fDR}/Al_{fDR}$ ratio is from 1.03 to 2.38 and the $Si_{rDR}/Al_{rDR}$ ratio is from 0.12 to 0.4, where $Al_{rDR}$ is the proportion of Al in the droplets 7 at the rake face 3, $Al_{fDR}$ is the proportion of Al in the droplets 7 at the flank face 4, $Si_{rDR}$ is the proportion of Si in the droplets 7 at the rake face 3, and $Si_{fDR}$ is the proportion of Si in the droplets 7 at the flank face 4. This allows that in the rake face 3, which is likely to be heated to high temperature because chippings pass thereon and which needs to have oxidation resistance, the droplets 7 have high oxidation resistance and therefore are unlikely to be altered during cutting and it is suppressed that the temperature of the coating layer is increased because chippings are brought into contact with the coating layer at a smooth surface portion of the rake face 3. Furthermore, in the flank face 4, which needs to have oxidation resistance, the wear resistance of the droplets 7 present at the flank face 4 is improved and the wear resistance of the coating layer 6 at the flank face 4 is improved.

Herein, the $Si_{rDR}/Si_{fDR}$ ratio is preferably from 0.48 to 0.73 from the viewpoint of suppressing the welding of the flank face to improve the roughness of a machined surface of a workpiece. Furthermore, the $Al_{rDR}/Al_{fDR}$ ratio is preferably from 2.42 to 3.29 from the viewpoint that the rake face 3 and the flank face 4 can be both optimized in wear resistance. The particularly preferable range of the $Al_{rDR}/Al_{fDR}$ ratio is from 2.60 to 3.2. The $Ti_{rDR}/Ti_{fDR}$ ratio is preferably from 0.40 to 0.70 from the viewpoint that the rake face 3 and the flank face 4 can be both optimized in chipping resistance, where $Ti_{rDR}$ is the Ti proportion of the droplets 7 formed on the surface of the rake face 3 of the coating layer 6 and $Ti_{fDR}$ is the Ti proportion of the droplets 7 formed on the surface of the flank face 4. The particularly preferable range of the $Ti_{rDR}/Ti_{fDR}$ ratio is from 0.42 to 0.65.

Furthermore, the number of the droplets 7 present at the flank face 4 is preferably less than the number of the droplets 7 present at the rake face 3 from the viewpoint that the increase in temperature of the coating layer 6 at the rake face 3 is reduced and a machined surface of a workpiece can be smoothed at the flank face 4.

C and N, which are non-metal components of the coating layer 6, have good hardness and toughness, which are necessary for cutting tools. The particularly preferable range of x (N composition proportion) is $0.5 \leq x \leq 1$. Herein, according to the present invention, the composition of the coating layer 6 can be measured by energy dispersive X-ray spectroscopy (EDX) or X-ray photoelectron spectroscopy (XPS).

The substrate 2 is preferably made of a hard material such as a cemented carbide which has a hard phase mainly containing tungsten carbide or titanium carbonitride and a binder phase mainly containing an iron-group metal such as nickel; a hard alloy such as cermet; a ceramic mainly containing silicon nitride or aluminium oxide; or an ultra-high-pressure sintered material prepared by calcining a hard phase made of polycrystalline diamond or cubic boron nitride and a binder phase made of a ceramic, an iron-group metal, or the like.

A physical vapor deposition (PVD) process such as an ion plating process or a sputtering process can be used to form the coating layer 6. An arc ion plating process is preferably used to form the droplets 7 on a surface of the coating layer 6.

(Manufacturing Method)

An example of a method for manufacturing the cutting tool according to the present invention is described below. First, the substrate is prepared by a conventionally known process so as to have a tool shape. Next, the coating layer is formed on a surface of the substrate. A physical vapor deposition (PVD) process such as an ion plating process or a sputtering process can be preferably used to form the coating layer. An example of a film-forming process is described below in detail. In the case of preparing the coating layer by an ion plating process, the following targets or target is used: metal targets independently containing metallic titanium (Ti) and metallic aluminium (Al) and further containing metallic silicon (Si) and a metal M (M is at least one selected from the group consisting of Y, group 4 metals other than Ti, group 5 metals, and group 6 metals in the periodic table) as required or a composite alloy target containing these metals.

In this operation, according to the present invention, a main target is set on a side surface of a chamber, a target having an Si content higher than the content of another metal is set on a side surface of the chamber, a target in which the content of this metal is high is set on the upper surface of the chamber, and an appropriate arc current is applied to each target, whereby a film is formed. As a result, the formed coating layer and the droplets can be adjusted to a predetermined composition. As a method for preparing a target, the use of a sintered target prepared by mixing and sintering metal powders is likely to allow a larger number of the droplets to precipitate on a surface of the coating layer as compared to the use of an alloy target prepared by melting and re-solidifying a metal component.

As for film-forming conditions, the coating layer and the droplets are formed by a sputtering process or an ion plating process in which metal sources are evaporated and ionized by arc discharge or glow discharge using these targets to react with a nitrogen ($N_2$) gas which is a nitrogen source and a methane ($CH_4$)/acetylene ($C_2H_2$) gas which is a carbon source. In this operation, the substrate is set in such a position that the flank face is substantially parallel to a side surface of the chamber and the rake face is substantially parallel to the upper surface of the chamber. In this operation, an arc current of 100 A to 200 A is applied to the main target and an arc current of 80 A to 200 A is applied to a sub-target placed on the upper surface thereof.

A magnetic field is applied to generated arc plasma in such a way that a magnet is placed perpendicularly to the direction of a target with respect to the generated arc plasma or in another way, whereby the state of each evaporated metal component present in the plasma is varied. This allows droplets containing a large amount of Si to be predominantly produced on the rake face. In the case of forming the coating layer by the ion plating process or the sputtering process, a bias voltage of 35 V to 200 V is preferably applied in consideration of the crystal structure of the coating layer in consideration of the crystal structure of the coating layer in order that the coating layer can be prepared so as to have high hardness and in order to increase the adhesion of the substrate.

EXAMPLE 1

To a tungsten carbide (WC) powder with an average particle size of 0.5 μm, 10% by mass of a metallic cobalt (Co) powder and 0.8% by mass of a chromium carbide ($Cr_3C_2$) powder were added, followed by mixing. The mixture was formed into throw-away cutting tool (BDMT11T308ER-JT) insert forms manufactured by Kyocera Corporation, followed by calcination. After being subjected to a grinding step, each form was surface-cleaned with an alkali, an acid, and distilled water in that order, whereby a cutting insert substrate was prepared.

A coating layer shown in Table 1 was formed at a bias voltage shown in Table 1 in such a manner that the substrate was set in an arc ion plating system equipped with targets shown in Table 1 and was heated to 500° C. Main targets used were sintered targets prepared by mixing and then sintering metal powders by a sintering process. Three of the main targets were set on a side wall of a chamber. Sub-targets used were sintered targets or alloy targets prepared by melting and then re-solidifying metals shown in Table 1. One of the sub-targets was set in a set position on a wall of the chamber as shown in Table 1. Deposition conditions were as follows: an arc current shown in Table 1 was applied to an atmosphere, supplied with a nitrogen gas, having a total pressure of 4 Pa.

Obtained inserts were observed for structure at 50,000× magnification using a scanning electron microscope (VE 8800) manufactured by Keyence Corporation, whereby the shape of crystals forming each coating layer and the thickness ($t_r$, $t_f$) of the coating layer were confirmed. Furthermore, the composition of the coating layer was determined at an acceleration voltage of 15 kV by the ZAF method, which is a kind of energy dispersive X-ray spectroscopy (EDX), using an EDAX analyzer (AMETEK EDAX-VE 9800) attached to the system; rake faces and flank faces were each measured for the proportion of Ti, Al, and Si; and $Si_r$, $Si_f$, $Al_r$, $Al_f$, $Ti_r$, and $Ti_f$ were calculated. The results were shown in Tables 1 and 2.

TABLE 1

| Sample No. | Target Main[1] | Target Sub | Set position | Bias voltage (V) | Arc current (A) Main target | Arc current (A) Sub-target | Rake face (the unit is atomic percent and the thickness is μm) Composition of rake face | $Si_r$ | $Al_r$ | $Ti_r$ | $M_r^{[2]}$ | Layer thickness $t_r$ |
|---|---|---|---|---|---|---|---|---|---|---|---|---|
| I-1 | TiSiW | Al | Upper surface | 60 | 100 | 120 | $Ti_{31.5}Al_{59.1}W_{5.9}Si_{3.5}N$ | 3.5 | 59.1 | 31.5 | 5.9 | 3.5 |
| I-2 | TiAlNbSi | AlW | Upper surface | 75 | 110 | 150 | $Ti_{28.6}Al_{63.6}W_{0.1}Nb_{2.0}Si_{5.7}N$ | 5.7 | 63.6 | 28.6 | 2.1 | 2.5 |

TABLE 1-continued

| | Target | | | Arc current (A) | | Rake face (the unit is atomic percent and the thickness is μm) | | | | | |
|---|---|---|---|---|---|---|---|---|---|---|---|
| Sample No. | Main[1] | Sub | Set position | Bias voltage (V) | Main target | Sub-target | Composition of rake face | $Si_r$ | $Al_r$ | $Ti_r$ | $M_r$[2] | Layer thickness $t_r$ |
| I-3 | TiAlSi | TiSi | Lower surface | 50 | 80 | 90 | $Ti_{35.1}Al_{53.2}Si_{11.7}C_{0.3}N_{0.7}$ | 11.7 | 53.2 | 35.1 | 0 | 4.1 |
| I-4 | TiAlMo | TiSi | Side surface | 100 | 200 | 175 | $Ti_{37.5}Al_{49.0}Si_{6.0}Mo_{7.5}N$ | 6 | 49.0 | 37.5 | 7.5 | 1.9 |
| I-5 | TiSiCr | TiAlW | Lower surface | 35 | 120 | 140 | $Ti_{25.3}Al_{47.6}Cr_{20.4}W_{3.7}Si_{3.0}N$ | 3.0 | 47.6 | 25.3 | 24 | 2.7 |
| I-6 | TiSi | AlW | Lower surface | 120 | 75 | 100 | $Ti_{41.8}Al_{44.5}W_{4.8}Si_{8.9}N$ | 8.9 | 44.5 | 41.8 | 4.8 | 1.8 |
| I-7 | TiAlW | AlSi | Upper surface | 35 | 100 | 100 | $Ti_{31.1}Al_{51.6}W_{1.2}Si_{16.1}N$ | 16.1 | 51.6 | 31.1 | 1.2 | 3.5 |
| I-8 | TiAl | TiAl | Lower surface | 120 | 120 | 150 | $Ti_{48.8}Al_{51.2}N$ | — | 51.2 | 48.8 | 0 | 3.6 |
| I-9 | TiAlSiW | — | | 75 | 170 | — | $Ti_{41.1}Al_{41.5}Si_{11.3}W_{6.1}N$ | 11.3 | 41.5 | 41.1 | 6.1 | 2.2 |

[1]Main targets are all set on a side wall of a chamber.
[2]M is at least one selected from the group consisting of Y, group 4 metals other than Ti, group 5 metals, and group 6 metals in the periodic table.

TABLE 2

| | Flank face (the unit is atomic percent and the layer thickness is μm) | | | | | | | | | | | |
|---|---|---|---|---|---|---|---|---|---|---|---|---|
| Sample No. | $Si_f$ | $Al_f$ | $Ti_f$ | $M_f$[2] | Layer thickness $t_f$ | $Si_r/Si_f$ | $Al_r/Al_f$ | $Si_r/Ti_r$ | $Si_f/Ti_f$ | $Al_r/Ti_r$ | $Al_f/Ti_f$ | $t_r/t_f$ |
| I-1 | 7.6 | 42.5 | 44.4 | 5.5 | 4.5 | 2.17 | 1.39 | 0.11 | 0.17 | 1.88 | 0.96 | 0.78 |
| I-2 | 10.6 | 45.2 | 42.4 | 1.8 | 3.5 | 1.86 | 1.41 | 0.20 | 0.25 | 2.22 | 1.07 | 0.71 |
| I-3 | 12.3 | 51.1 | 34.7 | 1.9 | 4.3 | 1.05 | 1.04 | 0.33 | 0.35 | 1.52 | 1.47 | 0.95 |
| I-4 | 7.7 | 45.9 | 40.3 | 6.1 | 2.7 | 1.28 | 1.07 | 0.16 | 0.19 | 1.31 | 1.14 | 0.70 |
| I-5 | 9.2 | 31.5 | 34.2 | 25.1 | 3.9 | 3.07 | 1.51 | 0.12 | 0.27 | 1.88 | 0.92 | 0.69 |
| I-6 | 19.7 | 33.6 | 40.6 | 6.1 | 2.1 | 2.21 | 1.32 | 0.21 | 0.49 | 1.06 | 0.83 | 0.86 |
| I-7 | 31.5 | 50.6 | 16.8 | 1.1 | 3.7 | 1.96 | 1.02 | 0.52 | 1.88 | 1.66 | 3.01 | 0.95 |
| I-8 | — | 48.2 | 51.8 | 0 | 4.7 | — | 1.06 | — | — | 1.05 | 0.93 | 0.77 |
| I-9 | 7.5 | 51.6 | 36.1 | 4.8 | 3.1 | 0.66 | 0.80 | 0.27 | 0.21 | 1.01 | 1.43 | 0.71 |

Ten droplets present at each rake or flank face were selected in descending order of size. The composition of each droplet was measured, whereby the proportion of Si therein was determined. The average of the Si proportions of the ten droplets was calculated. An element unmeasurable by this method was measured in such a manner that a measurement region, about 200 μm, was irradiated with an X-ray from monochrome AlK (200 μm, 35 W, 15 kV) using a PHI X-ray photoelectron spectrometer (Quantum 2000). Furthermore, in order to compare the abundance of the droplets on the rake face to the abundance of the droplets on the flank face, droplets with a diameter of 1 μm or more were selected and the area occupied by these droplets with respect to the whole surface of the coating layer and the average diameter of these droplets were measured. The results were shown in Table 3.

Furthermore, a cutting test was performed under cutting conditions below using the obtained inserts. The results were shown in Table 3.

Cutting method: shoulder milling (milling)

Workpiece material: SKD11

Cutting speed: 150 m/minute

Feed: 0.12 mm/tooth

Depth of cut: a radial depth of cut of 10 mm, an axial depth of cut of 3 mm

Cutting condition: dry

Evaluation method: After cutting for 10 minutes, the amount of flank wear and the chipping of a cutting edge were measured.

TABLE 3

| | Surface droplets (rake face) | | | Surface droplets (flank face) | | | | |
|---|---|---|---|---|---|---|---|---|
| Sample No. | Content (area %) | Average diameter $W_r$ (μm) | Si content (atomic %) | Content (area %) | Average diameter $W_r$ (μm) | Si content (atomic %) | Width of flank wear (mm) | Cutting edge condition |
| I-1 | 11.6 | 1.52 | 3.2 | 13.7 | 0.95 | 6.7 | 0.025 | Steady wear |
| I-2 | 8.3 | 0.78 | 4.4 | 6.1 | 0.73 | 8.5 | 0.016 | Steady wear |

TABLE 3-continued

| | Surface droplets (rake face) | | | Surface droplets (flank face) | | | | |
| --- | --- | --- | --- | --- | --- | --- | --- | --- |
| Sample No. | Content (area %) | Average diameter $W_r$ (μm) | Si content (atomic %) | Content (area %) | Average diameter $W_r$ (μm) | Si content (atomic %) | Width of flank wear (mm) | Cutting edge condition |
| I-3 | 21.6 | 1.51 | 9.6 | 17.7 | 0.71 | 11.5 | 0.046 | Micro-chipping |
| I-4 | 6.7 | 0.69 | 9.5 | 6.1 | 0.76 | 26.1 | 0.029 | Steady wear |
| I-5 | 18.2 | 1.51 | 2.9 | 15.2 | 0.78 | 11.6 | 0.028 | Steady wear |
| I-6 | 10.6 | 1.51 | 8.8 | 9.6 | 0.75 | 23.6 | 0.039 | Welded |
| I-7 | 6.7 | 1.12 | 14.7 | 7.8 | 0.71 | 29.6 | 0.078 | Heavy crater wear |
| I-8 | 12.6 | 1.36 | — | 7.8 | 0.79 | — | 0.111 | Chipped |
| I-9 | 13.1 | 1.51 | 10.5 | 11.7 | 0.73 | 6.7 | 0.189 | Abnormal wear |

Tables 1 to 3 show that Sample No. I-7, which has an $Al_r/Al_f$ ratio of less than 1.03, has heavy crater wear due to the progress of oxidation and Sample No. I-8, which contains no Si, and Sample No. I-9, which have an $Al_r/Al_f$ ratio of less than 1.03, are chipped or have abnormal wear due to chipping.

In contrast, Sample Nos. I-1 to I-6, which have an $Si_f/Si_r$ ratio of 1.05 to 3.2 and an $Al_r/Al_f$ ratio of 1.03 to 1.6, have good fracture resistance, wear resistance, and cutting performance.

EXAMPLE 2

To a tungsten carbide (WC) powder with an average particle size of 0.8 μm, the tungsten carbide powder being a major component, 10% by mass of a metallic cobalt (Co) powder with an average particle size of 1.2 μm, 0.1% by mass of a vanadium carbide (VC) powder with an average particle size of 1.0 μm, and 0.3% by mass of a chromium carbide ($Cr_3C_2$) powder with an average particle size of 1.0 μm were added, followed by mixing. The mixture was formed into throw-away chips having a shape similar to the shape of a throw-away cutting tool (DCGT11T302MFP-GQ) manufactured by Kyocera Corporation. Each chip was degreased and was then calcined at 1,450° C. for one hour in a vacuum of 0.01 Pa, whereby a cemented carbide was prepared. A surface of a rake face of each sample was polished by blasting, brushing, or the like. Furthermore, the prepared cemented carbide was subjected to nose treatment (honing) by brushing.

Each coating layer having a composition shown in Table 4 was formed at a temperature of 550° C. in such a manner that a bias voltage shown in Table 1 was applied to a substrate prepared as described above; a predetermined arc current was applied to each of a main target, a sub-target on a side surface, and a sub-target on an upper surface; and electric fields were applied downward and upward to a target material caused to generate an arc current with permanent magnets fitted to the upper and lower surfaces of a chamber.

TABLE 4

| | Main target | | | Si source target | | | |
| --- | --- | --- | --- | --- | --- | --- | --- |
| Sample No. | Composition | Set position | Arc current (A) | Composition | Set position | Arc current (A) | Coating layer Rake face composition |
| II-1 | TiAlW | Side surface | 80 | NbSi | Upper surface | 100 | $Ti_{0.37}Al_{0.40}Nb_{0.03}W_{0.02}Si_{0.18}N$ |
| II-2 | TiAlCrSi | Side surface | 100 | AlSi | Upper surface | 100 | $Ti_{0.35}Al_{0.46}Cr_{0.05}Si_{0.14}N$ |
| II-3 | TiAlNb | Side surface | 50 | Si | Upper surface | 70 | $Ti_{0.39}Al_{0.45}Nb_{0.02}Si_{0.14}N$ |
| II-4 | TiAl | Side surface | 120 | WSi | Upper surface | 100 | $Ti_{0.3}Al_{0.47}W_{0.03}Si_{0.2}N$ |
| II-5 | TiAlZr | Side surface | 70 | Si | Upper surface | 80 | $Ti_{0.40}Al_{0.46}Si_{0.12}Zr_{0.02}N$ |
| II-6 | TiAlW | Side surface | 100 | Si | Upper surface | 110 | $Ti_{0.36}Al_{0.51}Si_{0.09}W_{0.04}N$ |
| II-7 | TiAl | Side surface | 120 | SiMo | Upper surface | 100 | $Ti_{0.37}Al_{0.43}Si_{0.16}Mo_{0.04}N$ |
| II-8 | TiAl | Side surface | 150 | AlSi | Side surface | 120 | $Ti_{0.28}Al_{0.68}Si_{0.04}N$ |
| II-9 | TiAlSiW | Side surface | 120 | | — | | $Ti_{0.2}Al_{0.51}Si_{0.28}W_{0.01}N$ |
| II-10 | TiAlNbSi | Side surface | 150 | | — | | $Ti_{0.39}Al_{0.45}Nb_{0.10}Si_{0.06}N$ |
| II-11 | TiAlW | Side surface | 120 | Si | Side surface | 100 | $Ti_{0.2}Al_{0.51}Si_{0.28}W_{0.01}N$ |

For each obtained sample, three sites in each of a rake face and flank face of a surface of the coating layer and droplets formed on the rake face and the flank face were observed; ten of the droplets in one field of view were selected in descending order of size and were measured for composition by energy dispersive X-ray spectroscopy (EDX) (AMETEK EDAX); and the composition of the rake face of the coating layer, the composition of the flank face thereof, and the composition of the droplets on each face were calculated as an average. In Tables 5 and 6, the average proportion (atomic percent) of Si in the droplets formed on the rake face, that of Al therein, and that of Ti therein are denoted as $Si_{rDR}$, $Al_{rDR}$, and $Ti_{rDR}$, respectively, and the average proportion (atomic percent) of Si in the droplets formed on the flank face, that of Al therein, and that of Ti therein are denoted as $Si_{fDF}$, $Al_{fDF}$, and $Ti_{fDF}$, respectively. In the above observation, for Sample Nos. II-1 to II-8 and II-11, the number of the droplets observed in one field of view in the rake face was larger than that in the flank face as shown in FIGS. 3 and 4; however, Sample Nos. 9 and 10 were substantially even.

TABLE 5

| Sample No. | Coating layer Flank face composition | Ratio $Si_f/Si_r$ | $Al_r/Al_f$ | Rake face $Si_{rDR}$ | $Al_{rDR}$ | $Ti_{rDR}$ | $Si_{rDR}/Al_{rDR}$ |
|---|---|---|---|---|---|---|---|
| II-1 | $Ti_{0.38}Al_{0.37}Nb_{0.03}W_{0.02}Si_{0.20}N$ | 1.11 | 1.08 | 0.21 | 0.61 | 0.18 | 0.34 |
| II-2 | $Ti_{0.36}Al_{0.44}Cr_{0.05}Si_{0.15}N$ | 1.07 | 1.05 | 0.09 | 0.66 | 0.25 | 0.14 |
| II-3 | $Ti_{0.40}Al_{0.38}Nb_{0.02}Si_{0.20}N$ | 1.43 | 1.18 | 0.19 | 0.56 | 0.25 | 0.34 |
| II-4 | $Ti_{0.32}Al_{0.41}W_{0.04}Si_{0.23}N$ | 1.15 | 1.15 | 0.18 | 0.61 | 0.21 | 0.30 |
| II-5 | $Ti_{0.41}Al_{0.44}Si_{0.13}Zr_{0.02}N$ | 1.08 | 1.05 | 0.08 | 0.48 | 0.44 | 0.17 |
| II-6 | $Ti_{0.36}Al_{0.43}Si_{0.17}W_{0.04}N$ | 1.89 | 1.19 | 0.10 | 0.46 | 0.44 | 0.22 |
| II-7 | $Ti_{0.36}Al_{0.41}Si_{0.18}Mo_{0.05}N$ | 1.13 | 1.05 | 0.18 | 0.46 | 0.36 | 0.39 |
| II-8 | $Ti_{0.29}Al_{0.66}Si_{0.05}N$ | 1.25 | 1.03 | 0.06 | 0.53 | 0.41 | 0.11 |
| II-9 | $Ti_{0.2}Al_{0.51}Si_{0.28}W_{0.01}N$ | 1.00 | 1.00 | 0.28 | 0.54 | 0.18 | 0.52 |
| II-10 | $Ti_{0.39}Al_{0.45}Nb_{0.10}Si_{0.06}N$ | 1.00 | 1.00 | 0.10 | 0.58 | 0.32 | 0.17 |
| II-11 | $Ti_{0.21}Al_{0.49}Si_{0.29}W_{0.01}N$ | 1.04 | 1.04 | 0.18 | 0.54 | 0.28 | 0.33 |

Next, a cutting test was performed under cutting conditions below using obtained throw-away chips. The results were shown in Table 6.
Cutting method: external turning
Workpiece material: carbon steel (S45C)
Cutting speed: 120 m/minute
Feed: 0.05 mm/tooth
Depth of cut: 1.2 mm
Cutting condition: wet
Evaluation method: the number of workpieces capable of being machined by the end of the life of a tool was checked and the wear of the tool was checked.

TABLE 6

| Sample No. | Flank face $Si_{fDR}$ | $Al_{fDR}$ | $Ti_{fDR}$ | $Si_{fDR}/Al_{fDR}$ | Ratio $Si_{rDR}/Si_{fDR}$ | $Al_{rDR}/Al_{fDR}$ | $Ti_{rDR}/Ti_{fDR}$ | Cutting results Number of workpieces (pieces) | Cutting edge condition |
|---|---|---|---|---|---|---|---|---|---|
| II-1 | 0.34 | 0.23 | 0.43 | 1.48 | 0.62 | 2.65 | 0.42 | 1840 | Steady wear |
| II-2 | 0.47 | 0.20 | 0.33 | 2.35 | 0.19 | 3.30 | 0.76 | 852 | Chipped |
| II-3 | 0.40 | 0.21 | 0.39 | 1.90 | 0.48 | 2.67 | 0.64 | 1310 | Steady wear |
| II-4 | 0.37 | 0.19 | 0.44 | 1.95 | 0.49 | 3.21 | 0.48 | 1400 | Steady wear |
| II-5 | 0.21 | 0.20 | 0.59 | 1.05 | 0.38 | 2.40 | 0.75 | 1012 | Crater wear |
| II-6 | 0.16 | .014 | 0.70 | 1.14 | 0.63 | 3.29 | 0.63 | 1025 | Micro-chipping |
| II-7 | 0.29 | 0.19 | 0.52 | 1.53 | 0.62 | 2.42 | 0.69 | 1250 | Steady wear |
| II-8 | 0.25 | 0.22 | 0.53 | 1.14 | 0.24 | 2.41 | 0.77 | 314 | Heavy crater wear Fractured |
| II-9 | 0.28 | 0.12 | 0.60 | 2.33 | 1.00 | 4.50 | 0.30 | 751 | Heavy crater wear Chipped |
| II-10 | 0.29 | 0.32 | 0.39 | 0.91 | 0.34 | 1.81 | 0.82 | 553 | Heavy crater wear |
| II-11 | 0.31 | 0.12 | 0.57 | 2.58 | 0.58 | 4.50 | 0.49 | 825 | Heavy crater wear Chipped |

Results shown in Tables 4 to 6 show that Sample No. II-8, in which the $Si_{rDR}/Al_{rDR}$ ratio of a rake face is less than 0.12, has fracture and Sample No. II-9, in which the $Si_{rDR}/Al_{rDR}$ ratio of a rake face is greater than 0.4, is chipped. Furthermore, Sample No. II-10, in which the $Si_{fDR}/Al_{fDR}$ ratio of a flank face is less than 1.03, has heavy crater wear and Sample No. II-11, in which the $Si_{fDR}/Al_{fDR}$ ratio of a flank face is greater than 2.38, is seriously chipped.

In contrast, Sample Nos. II-1 to II-7, in which the $Si_f/Si_r$ ratio ranges from 1.05 to 3.2, the $Al_r/Al_f$ ratio ranges from 1.03 to 1.6, the $Si_{fDR}/Al_{fDR}$ ratio ranges from 1.03 to 2.38, and the $Si_{rDR}/Al_{rDR}$ ratio ranges from 0.12 to 0.4, have good chipping resistance and exhibit good cutting performance.

REFERENCE SIGNS LIST 1 cutting tool
2 substrate
3 rake face
4 flank face
5 cutting edge
6 coating layer
7 droplets

The invention claimed is:

1. A cutting tool, comprising:
a substrate comprising a rake face and a flank face;
a coating layer on the substrate, comprising $Ti_{1-a-b-c}Al_aSi_bM_c(C_{1-x}N_x)$ where M is at least one selected from the group consisting of Y, Group-4, 5, and 6 metals, excluding Ti, wherein following equations are satisfied at the rake face:

$0.3 \le a \le 0.7$;

$0.01 \le b \le 0.2$; $0 \le c \le 0.3$; and $0 < x \le 1$, and the following equations are also satisfied:

$1.05 \le Si_f/Si_r \le 3.2$ and $1.03 \le Al_r/Al_f \le 1.6$, where $Si_r$ is a proportion of Si in the coating layer at the rake face, $Si_f$ is a proportion of Si in the coating layer at the flank face, $Al_r$ is a proportion of Al in the coating layer at the rake face, and $Al_f$ is a proportion of Al in the coating layer at the flank face.

2. The cutting tool according to claim 1, wherein
an $Si_r/Ti_r$ ratio of the rake face is less than the $Si_f/Ti_f$ ratio of the flank face, and
an $Al_r/Ti_r$ ratio of the rake face is greater than the $Al_f/Ti_f$ ratio of the flank face, where $Ti_r$ is a proportion of Ti in the coating layer at the rake face and $Ti_f$ is a proportion of Ti in the coating layer at the flank face.

3. The cutting tool according to claim 1, wherein a thickness of the coating layer at the flank face is greater than a thickness of the coating layer at the rake face.

4. The cutting tool according to claim 1, wherein the coating layer comprises droplets thereon and $Si_{fDR}$ is higher than $Si_{rDR}$, wherein $Si_{fDR}$ is a proportion of Si in the droplets at the flank face and $Si_{rDR}$ is a proportion of Si in the droplets at the rake face.

5. The cutting tool according to claim 4, wherein following equations are satisfied:

$1.03 \le Si_{fDR}/Al_{fDR} \le ratio\ 2.38$; and $0.12 \le Si_{rDR}/Al_{rDR} \le 0.4$, where $Al_{rDR}$ is a proportion of Al in the droplets at the rake face, $Al_{fDR}$ is a proportion of Al in the droplets at the flank face.

6. The cutting tool according to claim 5, wherein an equation, $0.48 \le Si_{rDR}/Si_{fDR} \le 0.73$, is satisfied.

7. The cutting tool according to claim 5, wherein the following equations are satisfied:

$2.42 \le Al_{rDR}/Al_{fDR} \le 3.29$; and $0.40 \le Ti_{rDR}/Ti_{fDR} \le 0.70$.

8. The cutting tool according to claim 4, wherein a number of the droplets located at the flank face is less than a number of the droplets located at the rake face.

* * * * *